US008089769B2

(12) United States Patent
Casey

(10) Patent No.: US 8,089,769 B2
(45) Date of Patent: Jan. 3, 2012

(54) MULTIFUNCTIONAL/MODULAR SMOKE ALARM DEVICE

(76) Inventor: Daniel P. Casey, Seattle, WA (US)

( * ) Notice: Subject to any disclaimer, the term of this patent is extended or adjusted under 35 U.S.C. 154(b) by 315 days.

(21) Appl. No.: 12/604,990

(22) Filed: Oct. 23, 2009

(65) Prior Publication Data

US 2011/0038126 A1 Feb. 17, 2011

Related U.S. Application Data

(60) Provisional application No. 61/225,520, filed on Jul. 14, 2009.

(51) Int. Cl.
*H05K 7/00* (2006.01)

(52) U.S. Cl. ......................... 361/728; 361/730; 361/801

(58) Field of Classification Search .................. 361/728, 361/730, 752, 796, 800–803, 807, 810; 312/223.1, 312/223.2; 340/628, 630, 577, 578, 552
See application file for complete search history.

(56) References Cited

U.S. PATENT DOCUMENTS 3,434,133 A 3/1969 Collum
4,623,878 A * 11/1986 Schoenwetter ............... 340/628
4,710,756 A 12/1987 Thornburg et al.
5,139,464 A 8/1992 Lehnert
5,519,382 A 5/1996 Pope et al.
6,114,967 A * 9/2000 Yousif ........................... 340/690
6,160,487 A * 12/2000 DeLuca ..................... 340/693.7
6,181,251 B1 * 1/2001 Kelly ............................ 340/628
7,034,702 B2 * 4/2006 Thomas et al. ............... 340/628
7,336,165 B2 * 2/2008 Fuchs ........................... 340/506

FOREIGN PATENT DOCUMENTS

WO 2005/035910 A1 4/2005

* cited by examiner

*Primary Examiner* — Hung S Bui

(57) ABSTRACT

An improved smoke detector device comprising a base for mounting to a place on a ceiling or a wall via a mounting means; and a ring for removably attaching to the base, the ring comprising at least two modules that removably connect together via a connecting means to form the ring, wherein each module comprises an inner chamber and a door, the inner chamber of each module can hold an item, the door of each module can move between an open position and a closed position for respectively allowing and preventing access to the inner chamber of the module.

19 Claims, 6 Drawing Sheets

MULTIFUNCTIONAL/MODULAR SMOKE ALARM DEVICE

CROSS REFERENCE

This application claims priority to U.S. provisional application Ser. No. 61/225,520 filed Jul. 14, 2009, the specifications of which is incorporated herein by reference in its entirety.

FIELD OF THE INVENTION

The present invention is directed to smoke detectors, more particularly to an improved smoke detector comprising a plurality of modules for storing various items.

BACKGROUND OF THE INVENTION

Standard smoke detectors can be found in every home and building. The present invention features an improved smoke detector device. The smoke detector device can be mounted on a wall or ceiling including but not limited to an existing electrical fixture/box. The smoke detector device comprises a mountable base around which a ring-like structure can be attached. The ring-like structure may comprise a plurality of interconnecting modules, each module adapted to hold an item such as a smoke detector component, a speaker, a wireless network card, a camera, and/or the like. The ring-like structure provides versatility to the smoke detector device.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DESCRIPTION OF PREFERRED EMBODIMENTS

Referring now to FIG. 1-6, the present invention features an improved smoke detector device 100. The smoke detector device 100 comprises a plurality of interconnecting modules (forming a ring-like structure around a central base) for storing various items, increasing the versatility of the smoke detector device 100.

Figure 3:
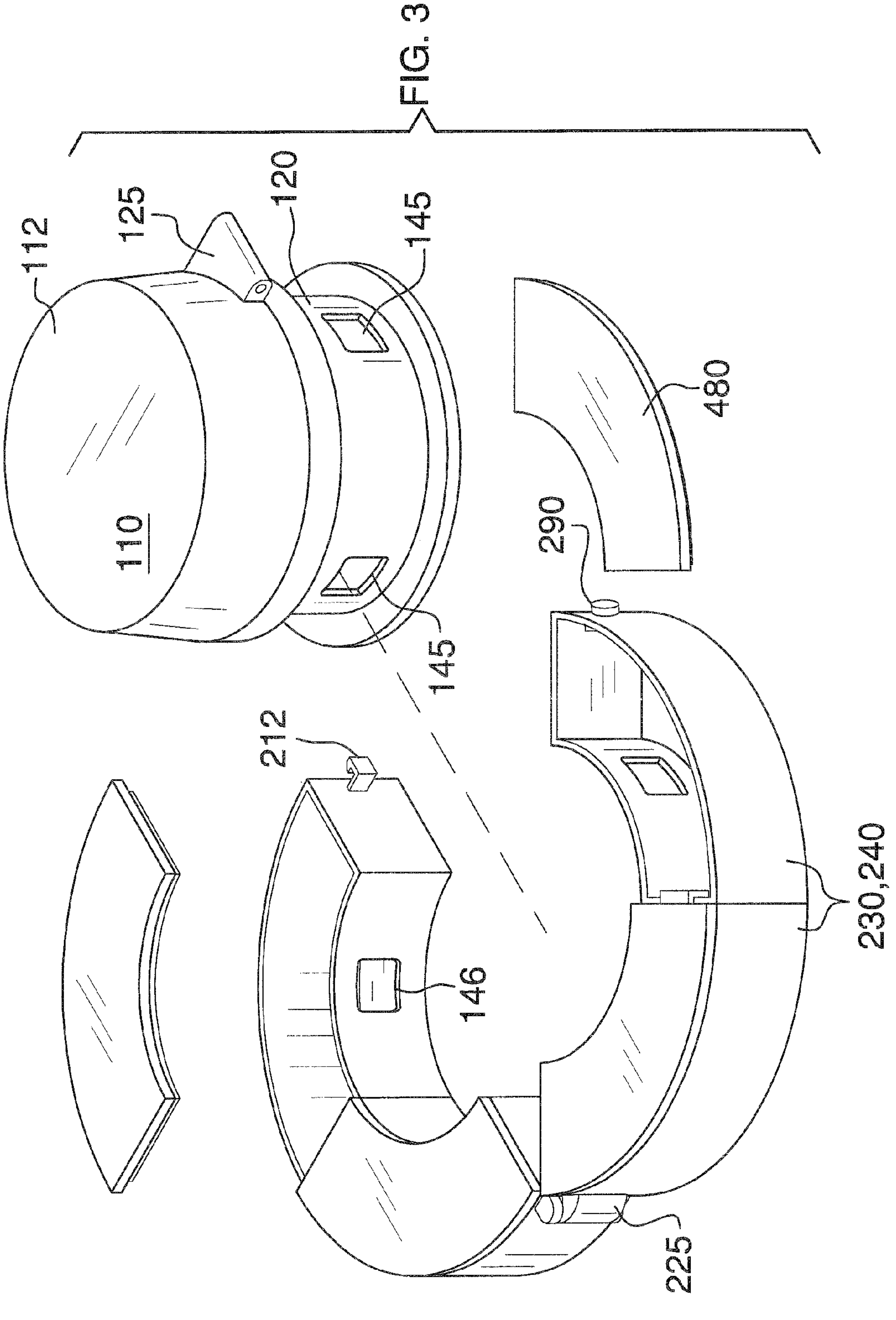
FIG. 3 is a second exploded view of the smoke alarm device of FIG. 1.
Figure 4:
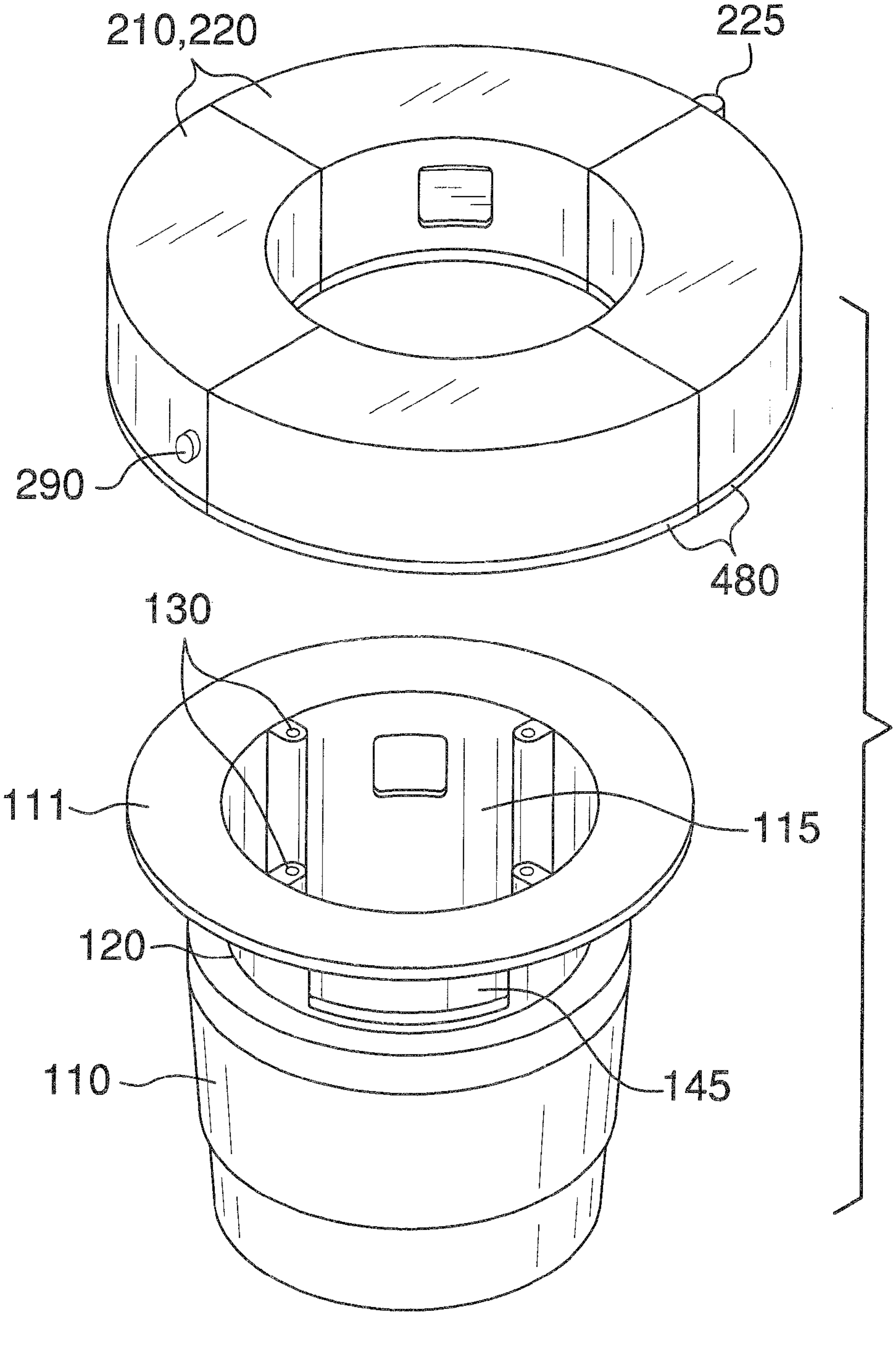
FIG. 4 is a third exploded view of the smoke alarm device of FIG. 1.

As shown in FIG. 3 and FIG. 4, the smoke detector device 100 comprises a base 110 for mounting on a wall or ceiling. The smoke detector device 100 may be mounted to a place on the wall or ceiling that is aligned with a beam or joist. In some embodiments, the smoke detector device 100 is mounted to (and in some cases connected to) an existing electrical fixture/box (e.g., a light fixture). For example, the wire components of the existing electrical fixture may be used by the smoke detector device 100 or by both the existing electrical fixture and the smoke detector device 100. In some embodiments, the smoke detector device 100 does not utilize the wire components of the existing electrical fixture/box. For example, the smoke detector device 100 is operatively connected to a battery power source, eliminating the need to be operatively connected to wire components of an existing electrical fixture.

The base 110 has an inner cavity, a top end 111, and a bottom end 112. In some embodiments, the base 110 is generally cylindrical in shape. Disposed in the top end 111 of the base 110 is a top aperture 115. In some embodiments, electrical wires, for example wires from the existing electrical fixture, may be inserted into the inner cavity of the base 110 via the top aperture 115. In some embodiments, a groove 120 is disposed in the base 110, for example near the top end 111.

Disposed in the base 110 (e.g., in the inner cavity of the base 110) at the top end 111 of the base 110 is one or more mounting holes 130 adapted to receive screws, bolts, nails, and the like. The mounting holes 130 allow the base 110 to be attached to the wall, ceiling, or electrical box. The base 110 is attached to the wall or ceiling such that the top end 111 of the base 110 is generally flush with the wall or ceiling. The screws, bolts, and/or nails can be driven through the mounting holes 130, through the ceiling or wall, and further into the beam or joist in the ceiling or wall. In some embodiments, the mounting holes 130 are positioned at edges of the top aperture 115 (see FIG. 4).

In some embodiments, the bottom end 112 or a portion of the base 110 at the bottom end 112 functions as a removable cover, for example the bottom end 112 (or a portion of the base 110 at the bottom end 112) can be removed from the base 110 for allowing access to the inner cavity of the base 110. In some embodiments, the bottom end 112 of the base 110 is removed so a user can access to the mounting holes 130 and attach the base 110 to the wall or ceiling. In some embodiments, the bottom end 112 or a portion of the base 110 at the bottom end 112 is removably attached to the base via an attachment means, for example a first hinge mechanism 125.

In some embodiments, the bottom end 112 of the base 110 (or a portion of the base 110 at the bottom end 112) can be removed and an alternative item can be attached to the base 110 in its place. For example, in some embodiments, a light or a speaker is installed in place of the bottom end 112 of the base 110. In some embodiments, if the smoke detector device 100 is connected to an existing electrical fixture/box, the existing electrical fixture can still function as it did previously before the smoke detector device 100 was added. As an example, if the smoke detector device 100 is connected to an existing light fixture box, a light can be installed in lieu of the bottom end 112 of the base 110, allowing the light fixture box to still function to support the light while simultaneously supporting the smoke detector device 100.

Figure 1:
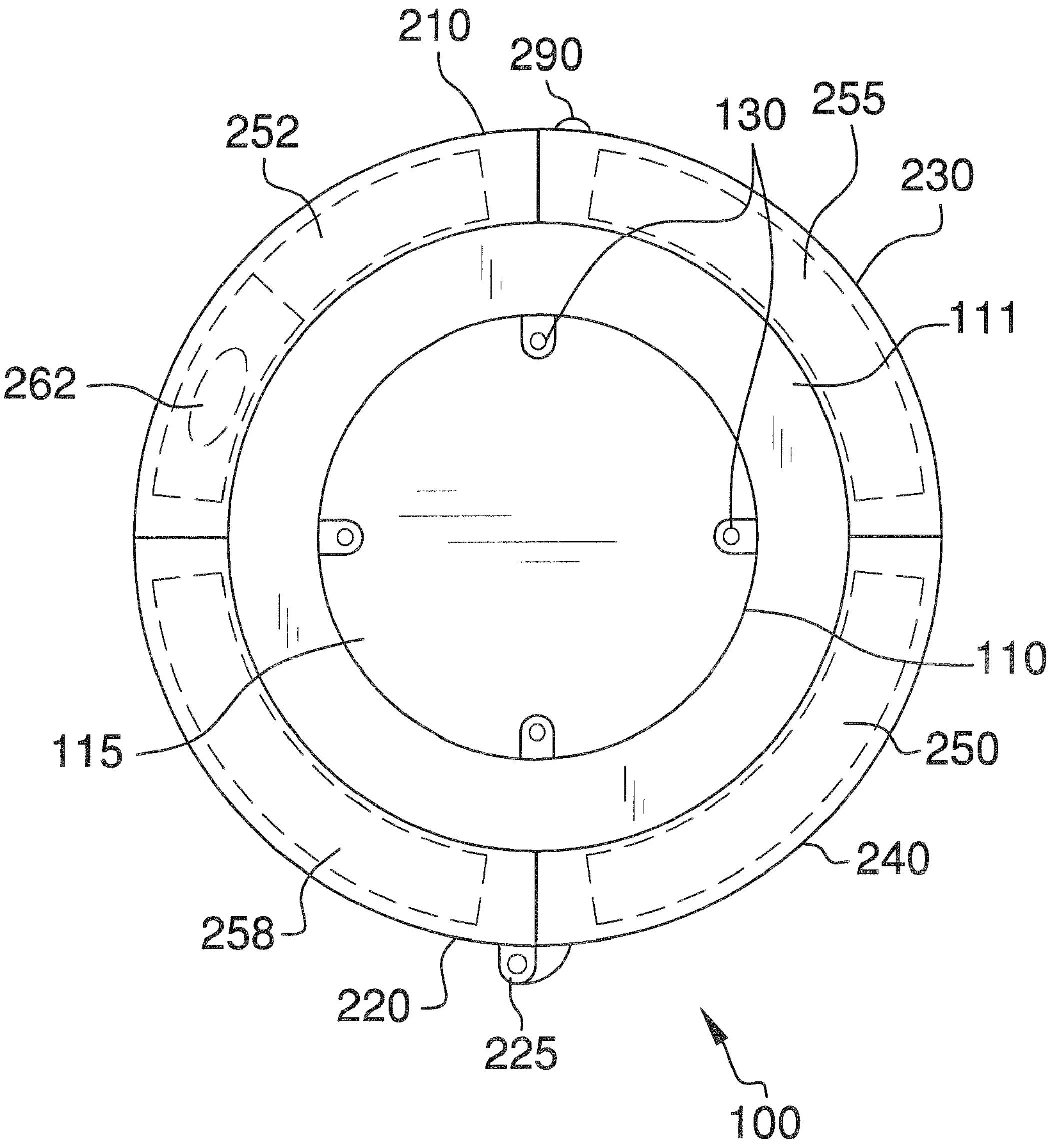
FIG. 1 is a top and internal view of a first embodiment of the smoke alarm device of the present invention.
Figure 2:
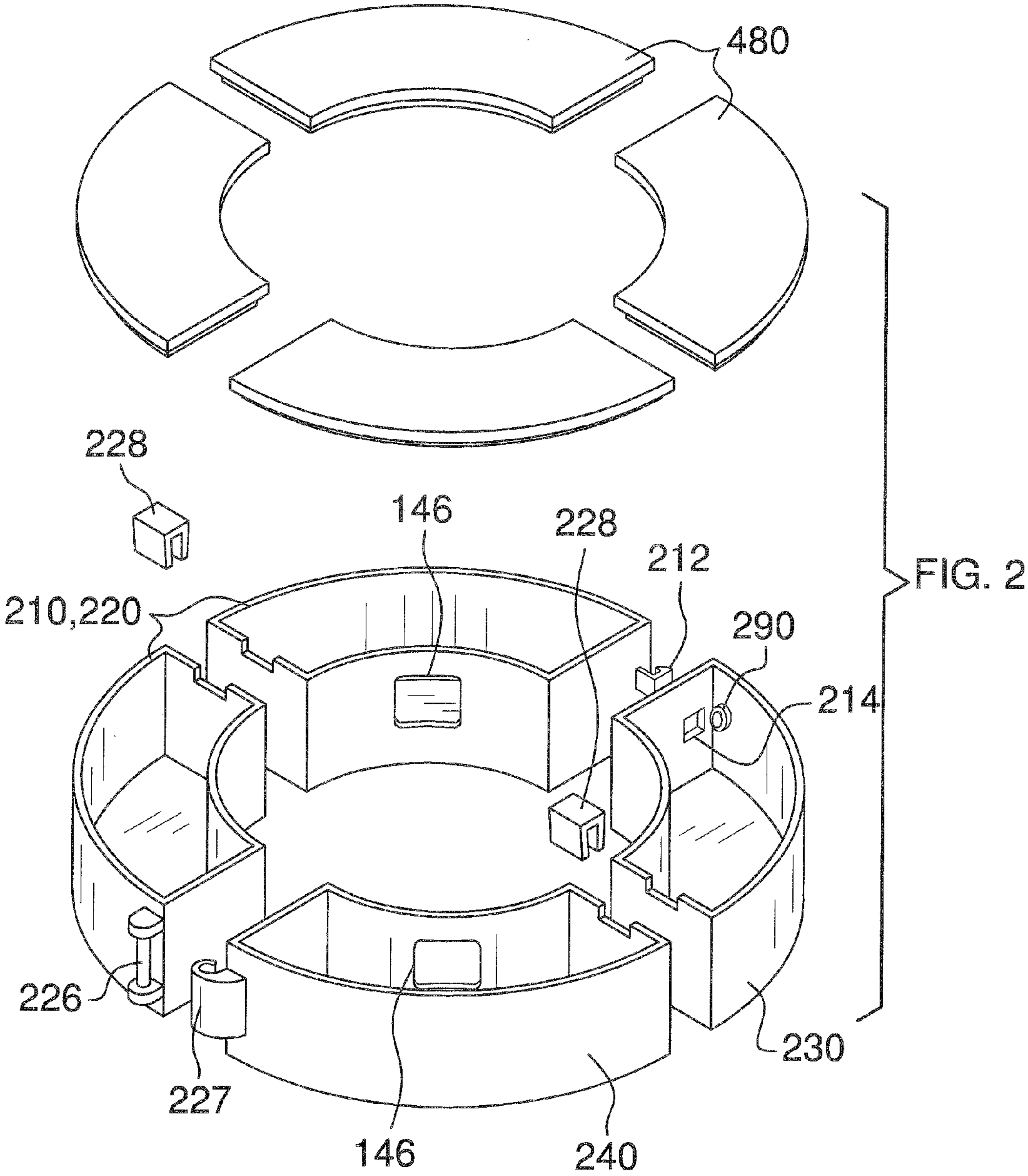
FIG. 2 is a first exploded view of the smoke alarm device of FIG. 1.

The smoke detector device 100 further comprises a ring 200 that can be removably attached to (e.g., wrapping around) the base 110. The ring 200 can move between an open and closed position so as to be fitted onto the base 110. In some embodiments, the ring 200 wraps around (e.g., snugly fits into) the groove 120 of the base 110. As shown in FIG. 1 and FIG. 2, the ring 200 may be generally circular in shape. The ring 200 is not limited to a standard circular ring shape. In some embodiments, the shape of the ring 200 is generally oval, rectangular or square, triangular, pentagonal, hexagonal, octagonal, trapezoidal, irregular, or the like. The ring 200 is not limited to the aforementioned shapes.

The ring 200 can pivot between an open position and a closed position, for example via a second hinge mechanism 225. The ring 200 may be divided into a first half ring and a second half ring, each half ring having a first end and a second end. The first end of the first half ring is pivotally attached to the first end of the second half ring, for example via the second hinge mechanism 225. The second hinge mechanism 225 may comprise hinge hook 227 disposed on the first end of the second half ring that engages (e.g., removably engages) a hinge rod 226 disposed on the first end of the first half ring. Hinge mechanisms are well known to one of ordinary skill in the art.

The second end of the first half ring may be locked to the second end of the second half ring to secure the ring 200 in the closed position. In some embodiments, a locking mechanism secures the ring 200 in the closed position. As an example, in some embodiments, a locking clip 212 is disposed on the second end of the first half ring. The locking clip 212 is for engaging a locking aperture 214 disposed in the second end of the second half ring. The locking clip 212 can snap into and out of the locking aperture 214. In some embodiments, a release button 290 is connected to the locking mechanism for unlocking the locking mechanism. For example, the release button 290 can move between a pressed position and a released position (the release button 290 may be biased in the released position, for example caused by a spring). When the release button 290 is in the pressed position, it pushes the locking clip 212 out of the locking aperture 214. Release buttons (e.g., spring-loaded buttons and the like) are well known to one of ordinary skill in the art.

The ring 200 is divided into one or more modules that connect together to form the ring via a connecting means. In some embodiments, the ring 200 is divided into two modules. In some embodiments, the ring 200 is divided into three modules. As shown in FIG. 1 and FIG. 2, in some embodiments, the ring 200 is divided into four modules, for example a first module 210, a second module 220, a third module 230, and a fourth module. The ring 200 is not limited to four modules, for example the ring 200 may comprise five, six, seven, eight, or more than eight modules. In some embodiments, the first module 210 and the second module 220 make up the first half ring. In some embodiments, the third module 230 and the fourth module 240 make up the second half ring.

As shown in FIG. 2, the modules can be separated from each other and put back together (e.g., via a connecting means) to reform the ring 200. In some embodiments, the second hinge mechanism 225 may be taken apart allowing the modules with the second hinge mechanism 225 to be separated. Separating the modules allows a user to modify the modules in the ring 200 as needed. For example, the user may have a ring 200 comprising two modules and wish to add more modules. He/she can replace one (or both) of the original modules with different modules. As an example, a single large module can be replaced with two smaller modules that combined fit where the original module was within the ring 200.

Each module has a first end and a second end. As shown in FIG. 2, the first end of the first module 210 comprises the locking clip 212 and the second end of the third module comprises the locking aperture 214 and the release button 290. The second end of the second module 220 comprises the hinge rod 226 and the first end of the fourth module 240 comprises the hinge hook 227. The locking mechanism and the second hinge mechanism 225 may be considered connecting means. The modules can be connected together via additional connecting means. In some embodiments, the modules can be connected together via assembly clips 228 that snugly snap onto ends of two modules. For example, the second end of the first module 210 can be secured to the first end of the second module via an assembly clip 228. The connecting means is not limited to assembly clips, and may include other standard connecting means such as clamps, snaps, adhesives, hook-and-loop fasteners, the like, or a combination thereof.

Each module has an inner chamber for holding items. Each module comprises a door 480 that can open and close respectively allowing and preventing access to the inner chamber of the module.

The modules of the smoke detector device 100 can accept other devices in addition to a smoke detecting component 250 including but not limited to a wireless network card 252, a speaker 255 (e.g., music speakers), a camera 272 (e.g., surveillance camera), a battery 258 (e.g., a rechargeable battery), a light 262, or a combination thereof. In some embodiments, the speakers can receive audio signals wirelessly from a music system (e.g., a stereo system, a MP3 player, etc.). In some embodiments, the music system comprises a corresponding wireless module attached to its audio output (for example, the AUX output on the back of the stereo). In some embodiments, the speaker 255 can also be programmed (e.g., via a microprocessor) to broadcast certain messages, for example a warning message in the case of a fire.

If needed, items in the modules can be operatively connected to a power source. In some embodiments, the power source is a battery (e.g., rechargeable battery). In some embodiments, the power source is the electrical system of the existing electrical fixture. Wires can be directed from the wall or ceiling into the inner cavity of the base 110 (via the top aperture). In some embodiments, a base wire opening 145 is disposed in the base 110 (e.g., in the groove 120 of the base 110). Wires can be directed out of the inner cavity of the base 110 and into a module (e.g., via a module wire opening 146 in the module). The base wire opening 145 in the base 110 may be aligned with the module wire opening 146 of the module.

Figure 5:
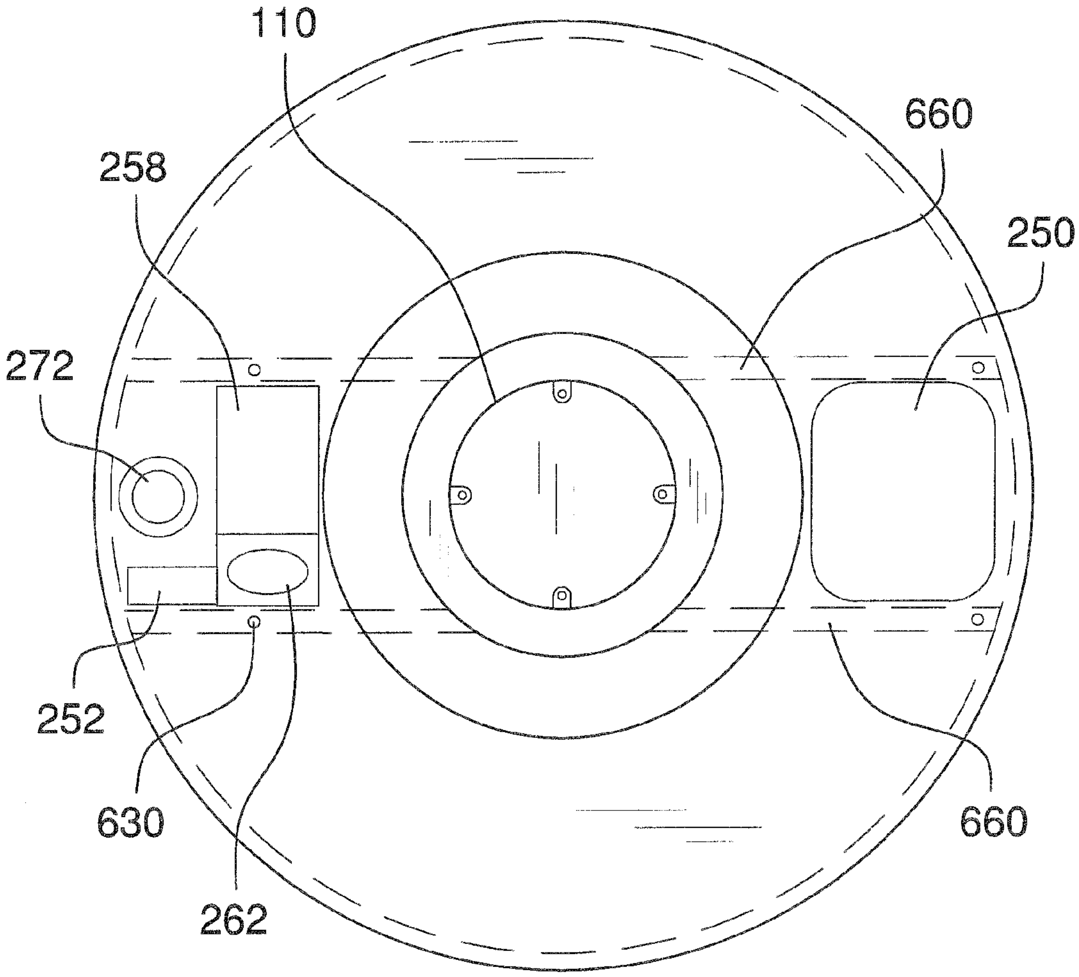
FIG. 5 is a top and internal view of a second embodiment of the smoke alarm device of the present invention.
Figure 6:
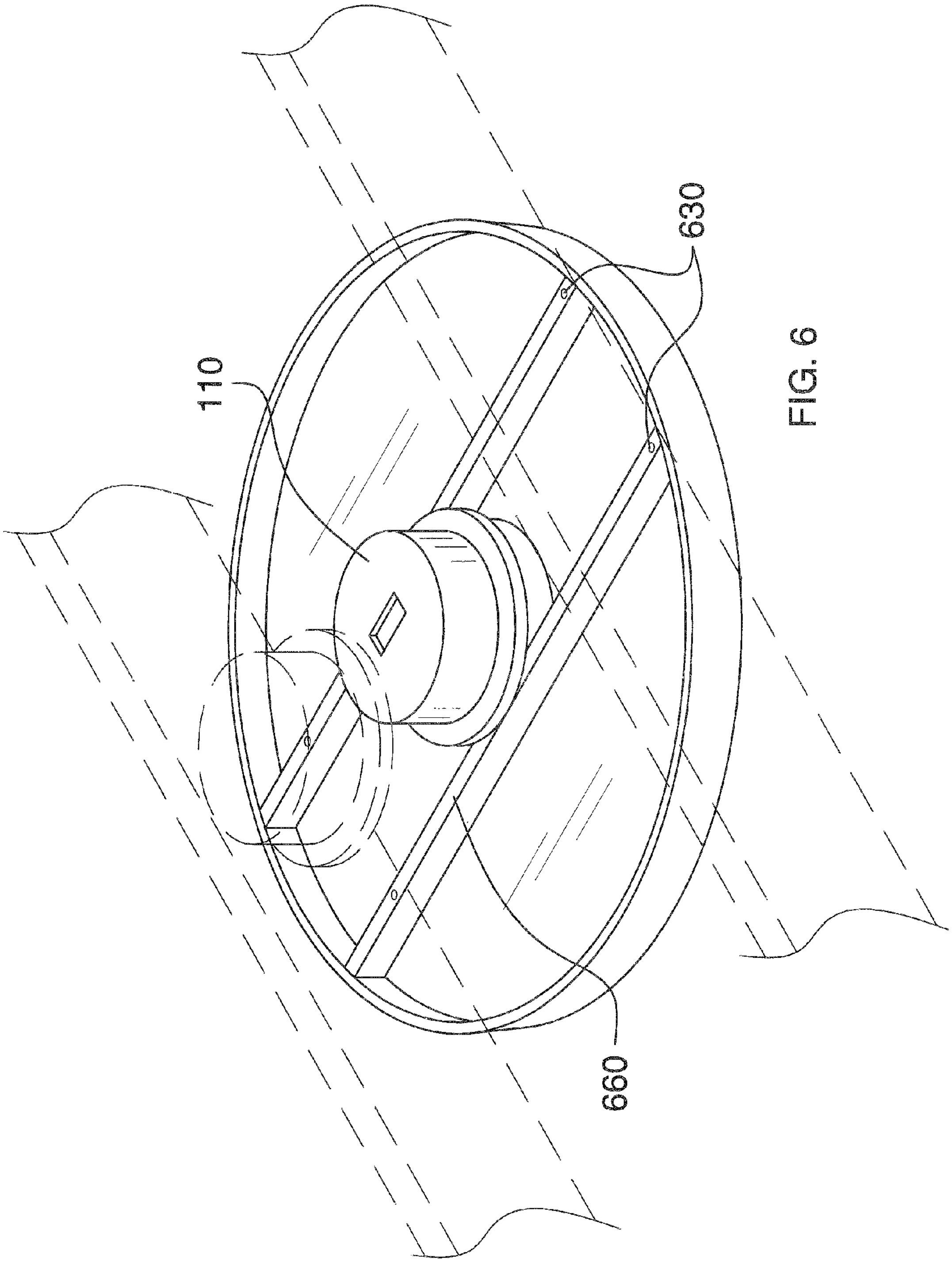
FIG. 6 is a perspective view of the smoke alarm device of FIG. 5.

As shown in FIG. 5 and FIG. 6, the ring 200 may comprise one or more (e.g., two) steel support rods for providing additional support when mounting the smoke detector device 100 to the wall or ceiling. The steel support rods 660 may run parallel to each other, spanning the ring from a first side to a second side. The steel support rods 660 may be positioned a certain distance apart so that the steel support rods 660 snugly fit around the base 110 (e.g., the groove 120 of the base 110). The steel support rods 660 have a first end and a second end, the first end having a first mounting hole 630 and the second end having a second mounting hole 630. The steel support rods are long enough to be attached to two beams or joists, for example the first end is aligned (e.g., perpendicularly aligned) with a first joist and the second end is aligned (e.g., perpendicularly aligned) with a second joist.

As shown in FIG. 5, in some embodiments, the steel support rods 660 and the base 110 combined form inner chambers that can hold various items including but not limited to a camera 272, a wireless network card 258, a light 262, a battery 252, and the smoke detector component 250.

In some embodiments, the smoke alarm component comprises a rechargeable battery than can be charged whenever the electrical fixture (e.g., light switch) is turned on. (The rechargeable battery may be operatively connected to the electrical fixture/wiring). This may eliminate the need for the user to replace the battery (which may require a possibly dangerous ascent up a ladder), as in current household smoke alarm designs. In some embodiments, the smoke detector component can alert the user when the battery needs charging via an alarm (beeping) or even a user-programmed voice message.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

What is claimed is:

1. An improved smoke detector device comprising:

(a) a base for mounting to a place on a ceiling or a wall via a mounting means; and (b) a ring for removably attaching to the base, the ring comprising at least two modules that removably connect together via a connecting means to form the ring, wherein each module comprises an inner chamber and a door, the inner chamber of each module can hold an item, the door of each module can move between an open position and a closed position for respectively allowing and preventing access to the inner chamber of the module.

2. The smoke detector device of claim 1, wherein the smoke detector device is mounted to an existing electrical fixture on the wall or ceiling.

3. The smoke detector device of claim 1, wherein the place on the ceiling or the wall is aligned with a beam or joist.

4. The smoke detector device of claim 1, wherein the base is generally cylindrical in shape.

5. The smoke detector device of claim 1, wherein a top aperture is disposed in a top end of the base for providing access to an inner cavity of the base.

6. The smoke detector device of claim 1 further comprising a groove disposed in the base.

7. The smoke detector device of claim 1, wherein the mounting means includes a mounting hole disposed in the base at the top end wherein the mounting hole is adapted to receive a screw, bolt, or nail, or an adhesive.

8. The smoke detector device of claim 7, wherein the mounting holes are positioned at edges of the top aperture.

9. The smoke detector device of claim 1, wherein a portion of the base at a bottom end can be temporarily removed for allowing access to the inner cavity of the base.

10. The smoke detector device of claim 1, wherein the ring can wrap around the groove of the base.

11. The smoke detector device of claim 1 comprising four or more modules.

12. The smoke detector device of claim 1, wherein the connecting means includes a hinge mechanism, a locking mechanism, an assembly clip, a clamp, a snap, an adhesive, a hook-and-loop fastener, or a combination thereof.

13. The smoke detector device of claim 12 further comprising a release button connected to the locking mechanism for unlocking the locking mechanism.

14. The smoke detector device of claim 1, wherein the item includes a smoke detecting component, a wireless network card, a speaker, a camera, a battery, a light, or a combination thereof.

15. The smoke detector device of claim 1, wherein the item is operatively connected to a power source, the power source including a battery or an electrical system of an existing electrical fixture.

16. The smoke detector device of claim 1, wherein a base wire opening is disposed in the groove of the base and a module wire opening is disposed in the module, the base wire opening can be aligned with the module wire opening so as to allow a wire from the inner cavity of the base to be directed into the module.

17. The smoke detector device of claim 1, wherein the ring comprises at least two steel support rods spanning the ring from a first side to a second side, the steel support rods generally parallel to each other.

18. The smoke detector device of claim 17, wherein the steel support rods snugly fit around the base.

19. The smoke detector device of claim 17, wherein the steel support rods each have a first end and a second end, the first end having a first mounting hole and the second end having a second mounting hole.

* * * * *